US011101788B2

(12) United States Patent
Ripley

(10) Patent No.: US 11,101,788 B2
(45) Date of Patent: Aug. 24, 2021

(54) ELECTRONICALLY TUNED RF TERMINATION

(71) Applicant: SKYWORKS SOLUTIONS, INC., Irvine, CA (US)

(72) Inventor: David Steven Ripley, Marion, IA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/297,804

(22) Filed: Mar. 11, 2019

(65) Prior Publication Data
US 2019/0288671 A1 Sep. 19, 2019

Related U.S. Application Data

(60) Provisional application No. 62/642,706, filed on Mar. 14, 2018.

(51) Int. Cl.
H03H 11/28 (2006.01)
H03F 3/45 (2006.01)
H03F 1/56 (2006.01)
H03F 3/20 (2006.01)
H01P 5/18 (2006.01)

(52) U.S. Cl.
CPC ............ H03H 11/28 (2013.01); H01P 5/184 (2013.01); H03F 1/56 (2013.01); H03F 3/20 (2013.01); H03F 3/45 (2013.01); H03F 2200/387 (2013.01); H03F 2200/451 (2013.01); H03F 2200/456 (2013.01); H03F 2200/471 (2013.01)

(58) Field of Classification Search
CPC ............ H03K 19/0005; H01L 2924/00; H01L 2924/0002; H04L 25/0278; H03H 11/28; H03H 11/53; H03H 11/54; H03F 3/45; H03F 1/56; H03F 3/20; H03F 3/45475; H03F 3/601; H03F 3/245; H03F 2200/456; H03F 2200/451; H03F 2200/387; H03F 2200/471; H03F 2200/204; H01P 5/184
See application file for complete search history.

(56) References Cited

U.S. PATENT DOCUMENTS 8,803,615 B2 8/2014 Cabanillas et al.
2002/0186066 A1* 12/2002 Soda .................... H03H 11/245
327/308

(Continued)

OTHER PUBLICATIONS

International Search Report and Written Opinion from corresponding International Application No. PCT/US2019/021567 dated Jun. 27, 2019.

Primary Examiner — Sibin Chen
(74) Attorney, Agent, or Firm — Lando & Anastasi, LLP

(57) ABSTRACT

Systems and methods for a tunable impedance are provided. A tunable impedance includes a transistor assembly having two terminals and a control input. The transistor assembly includes one or more transistors electrically connected between the two terminals to provide a first impedance between the two terminals, based upon a control signal. One or more replica transistors react to the control signal in a similar fashion as the transistor assembly, to provide a replica impedance based upon the control signal. A control circuit is configured to generate the control signal based upon a voltage across the replica transistor(s) and/or a current through the replica transistor(s).

20 Claims, 11 Drawing Sheets

(56) References Cited

U.S. PATENT DOCUMENTS

| | | | |
|---|---|---|---|
| 2010/0177588 A1* | 7/2010 | Kaiwa | G11C 7/22 |
| | | | 365/233.11 |
| 2010/0301934 A1 | 12/2010 | Drogi et al. | |
| 2014/0266458 A1 | 9/2014 | Scott et al. | |
| 2016/0079942 A1* | 3/2016 | Li | H04B 1/16 |
| | | | 375/318 |
| 2017/0063314 A1 | 3/2017 | Nobbe | |
| 2017/0346516 A1 | 11/2017 | Ripley et al. | |

* cited by examiner

ELECTRONICALLY TUNED RF TERMINATION

CROSS-REFERENCE TO RELATED APPLICATIONS

This application claims the benefits under 35 U.S.C. § 119(e) and PCT Article 8 of U.S. Provisional Application No. 62/642,706 filed on Mar. 14, 2018, which is herein incorporated by reference in its entirety for all purposes.

BACKGROUND

Various impedances are widely used in radio frequency and front end module (FEM) products, such as in radio transceivers, wireless handsets, and the like. For example, a directional coupler may be used to detect and monitor electromagnetic output power in a transmitter, or antenna reflected power, and may include a termination impedance at an isolation port. In some cases it is desirable for the termination impedance to be adjustable. An adjustable termination impedance may allow adjustments that account for, e.g., variations in manufacture or production, or impedance variation for differing frequencies, frequency bands, or other tuning, for instance.

Referring to FIG. 1, a coupler 100 typically has a power input port 102, a power output port 104, a coupled port 106, and an isolation port 108. The electromagnetic coupling mechanism, which can include inductive and/or capacitive coupling, is typically provided by two parallel or overlapped transmission lines, such as microstrips, strip lines, coplanar lines, and the like. A main transmission line 110 extends between the power input port 102 and the power output port 104. A coupled line 112 is positioned physically adjacent the main transmission line 110 and extends between the coupled port 106 and the isolation port 108 and may extract a portion of signal power traveling between the power input port 102 and the power output port 104 for various purposes, including various measurements. When a termination impedance 114 is connected to the isolation port 108, coupled signal that provides an indication of signal power traveling from the power input port 102 to the power output port 104 is produced at the coupled port 106. The termination impedance 114 may be adjustable, to account for tuning and/or trimming of the impedance value presented to the isolation port 108.

SUMMARY OF INVENTION

Aspects and embodiments are directed to systems and methods of providing a tunable impedance for various applications in, e.g., electromagnetic circuits. Tunable impedances disclosed herein are adjustable by control of one or more transistors, e.g., field effect transistors (FET's), to operate in a triode region such that the transistor(s) provide an adjustable resistance. A control circuit may include replica transistors from which an appropriate control signal is determined by monitoring the resistance and/or impedance of the replica transistors.

According to one aspect, a tunable impedance is provided and includes a transistor assembly having two terminals and a first control input, the transistor assembly having one or more transistors electrically connected between the two terminals, the one or more transistors arranged to provide a first impedance between the two terminals based upon a control signal received at the first control input, one or more replica transistors electrically connected together and having a second control input, the one or more replica transistors arranged to provide a replica impedance based upon the control signal received at the second control input, and a control circuit configured to generate the control signal based upon at least one of a voltage across the one or more replica transistors and a current through the one or more replica transistors.

In some embodiments, the one or more transistors may be arranged to provide the first impedance as a multiple of the replica impedance.

In various embodiments, the control circuit may be configured to provide a fixed current through the one or more replica transistors and to sense a voltage across the one or more replica transistors to generate the control signal. In some embodiments, the control circuit is configured to maintain a fixed voltage across the one or more replica transistors by adjusting the control signal. In some embodiments, the control circuit is configured to provide the fixed current based upon a digital input value. The control circuit may be configured to accept the digital input value as a combination of a tune value and a trim value.

In certain embodiments, the control circuit is configured to maintain the replica impedance by adjusting the control signal.

In some embodiments, the control circuit is configured to maintain a fixed voltage across the one or more replica transistors by adjusting the control signal. The control circuit may be configured to adjust the replica impedance by adjusting a current through the one or more replica transistors. The control circuit may adjust the current through the one or more replica transistors based upon a digital input value. The control circuit may adjust the current based upon temperature. In some embodiments, a digital to analog converter may be configured to provide the current.

In some embodiments, the control circuit is configured to maintain a fixed voltage across the one or more replica transistors by adjusting the control signal, and the control circuit is configured to adjust the fixed voltage based upon temperature.

In some embodiments, the control circuit is configured to maintain a fixed voltage across the one or more replica transistors by adjusting the control signal, and the control circuit includes an operational amplifier configured to maintain the fixed voltage.

In certain embodiments, each of the one or more replica transistors is of the same type as each of the one or more transistors.

In various embodiments, each of the one or more transistors is fabricated on one die and each of the one or more replica transistors is fabricated on the same die. In some embodiments, each of the one or more replica transistors is fabricated in a same nominal orientation as each of the one or more transistors.

In some embodiments, each of the one or more transistors is configured to operate in a triode region in response to the control signal received at the first control input.

In various embodiments, the control circuit is configured to generate the control signal with a range of values, the range of values of the control signal being such as to cause each of the one or more transistors to operate in a triode region of operation. Each of the one or more replica transistors may be configured to operate in a triode region in response to the range of values of the control signal received at the second control input.

According to another aspect, a control circuit is provided. The control circuit includes one or more transistors electrically connected together to provide two terminals and a control input, the one or more transistors arranged to provide an impedance between the two terminals based upon a control signal received at the control input, a current source to provide a current into one of the two terminals and through the one or more transistors, and a sensing circuit configured to sense a voltage between the two terminals and to generate the control signal based upon the sensed voltage.

Certain embodiments include one or more termination transistors arranged to receive the control signal and to provide a termination impedance based upon the control signal.

In some embodiments, the current source is configured to provide a fixed current through the one or more transistors. The current source may be configured to provide the fixed current based upon a digital input value. The current source may be configured to accept the digital input value having a tune value and a trim value. The current source may be configured to adjust the current based upon temperature. The current source may include a digital to analog converter configured to provide the current.

In various embodiments, the sensing circuit may be configured to maintain the voltage by adjusting the control signal and/or to maintain the impedance by adjusting the control signal.

In certain embodiments, the sensing circuit is configured to adjust the fixed voltage based upon temperature.

In some embodiments, the sensing circuit includes an operational amplifier configured to receive the voltage at an input of the operational amplifier.

In various embodiments, each of the one or more transistors is configured to operate in a triode region in response to the control signal received at the control input.

In various embodiments, the sensing circuit is configured to generate the control signal with a range of values, the range of values of the control signal being such as to cause each of the one or more transistors to operate in a triode region of operation.

According to another aspect, a method of controlling impedance of one or more transistors operating in a triode region of operation is provided. The method includes providing a control signal to a control input of one or more replica transistors to cause the one or more replica transistors to operate in a triode region, providing a current through the one or more replica transistors, the current entering the one or more replica transistors at a first terminal and exiting the one or more replica transistors at a second terminal, sensing a voltage between the first terminal and the second terminal, the voltage being across the one or more replica transistors, adjusting the control signal to maintain a desired ratio of the voltage to the current, and providing the control signal to a control input of the one or more transistors.

In some embodiments, providing the current includes providing a fixed current, and adjusting the control signal to maintain a desired ratio of the voltage to the current includes adjusting the control signal to maintain a constant voltage. The constant voltage may be based upon a temperature-compensated reference voltage. The constant voltage may be based upon a reference voltage that is compensated for bandgap bias. The constant voltage may be based upon a reference voltage that is compensated for temperature and for bandgap bias.

In various embodiments, adjusting the control signal to maintain a desired ratio of the voltage to the current includes adjusting the control signal to maintain the voltage at a fixed value, the desired ratio of the voltage to the current being determined by an amount of the provided current. The fixed value may be based upon a temperature-compensated reference value.

Certain embodiments further include adjusting the desired ratio of the voltage to the current by changing the current provided through the one or more replica transistors.

In some embodiments, the current provided is based upon a temperature compensated reference current.

Some embodiments include receiving a digital input value and providing the current based upon the digital input value, which may include a tune value and a trim value.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures may be represented by a like numeral. For purposes of clarity, not every component may be labeled in every figure. In the figures.

DETAILED DESCRIPTION

Various wireless or communication devices use impedances to affect a signal for various purposes. For example, electromagnetic couplers sense radio frequency or other signal levels at various locations along a signal path and may include termination impedances selected or controlled to cause the coupler to have enhanced performance characteristics, such as directionality, coupling factor, or insertion loss, for example, or to tailor performance for a certain frequency or band. In some applications, adjustability of an impedance may be desirable, such as to adjust certain performance characteristics of, e.g., a coupler, load, or splitter, to provide impedance matching, antenna tuning, or the like. Aspects and embodiments are directed to an adjustable impedance circuit implemented using a number of transistors and that can be connected to an electromagnetic coupler and configured to provide a tunable impedance at the isolation port of the coupler.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

Figure 1:
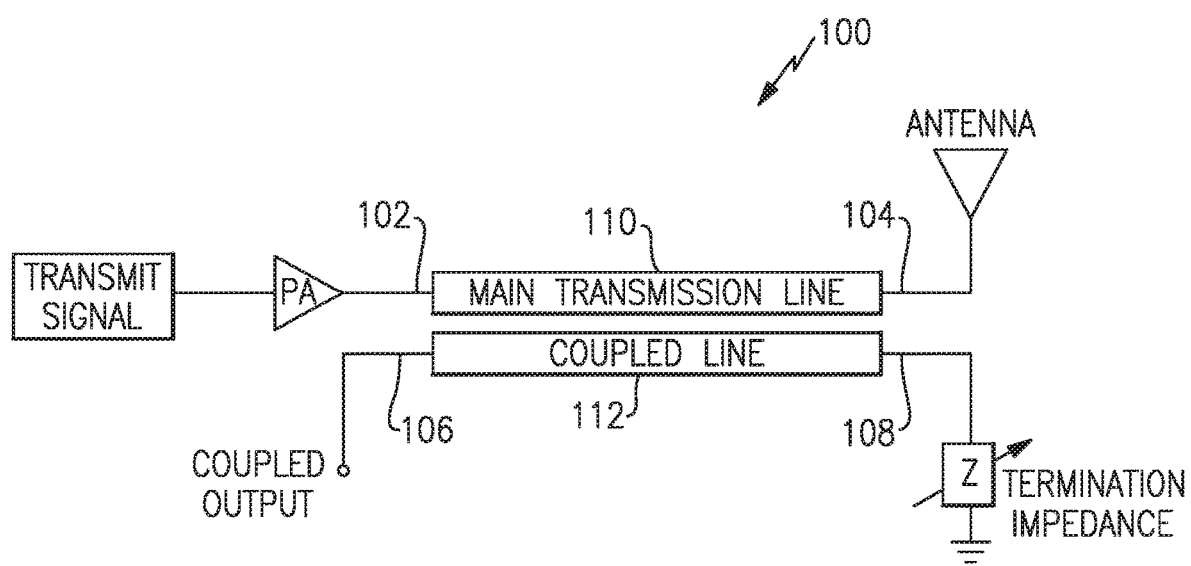
FIG. 1 is a schematic diagram of an electromagnetic coupler including an adjustable termination impedance.
Figure 2:
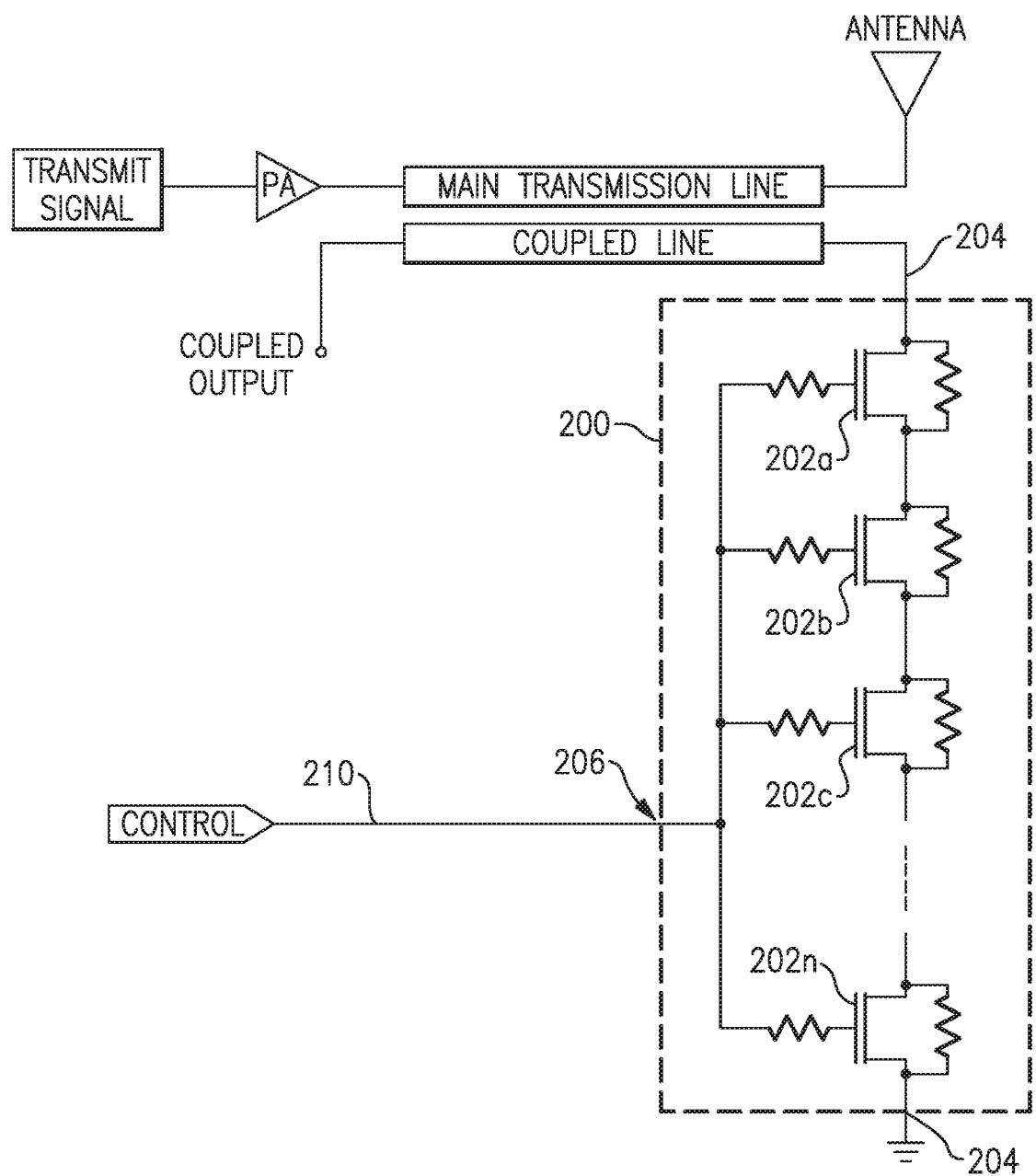
FIG. 2 is a schematic diagram of an electromagnetic coupler having one example of a tunable impedance connected to an isolation port.

FIG. 2 shows an example of an impedance circuit 200 that can be used as a termination impedance for a coupler. The impedance circuit 200 is adjustable and includes a number of transistors 202, e.g., field effect transistors (FETs), connected in series to form two terminals 204 between which an impedance is presented. Each of the transistors 202 includes a control terminal, such as a gate of the FET, connected together (with gate resistors in some embodiments) to provide a control terminal 206 at which a control signal 210 may be received. The control signal 210 is received by each of the transistors 202 and determines an impedance provided by each of the transistors 202 and, accordingly, determines the overall impedance between the terminals 204 provided by the impedance circuit 200. In some embodiments, some of the transistors 202 may be connected in parallel. For instance, the series of transistors 202 illustrated in FIG. 2 may be coupled in parallel with additional series of transistors of like form, e.g., to provide higher current carrying capacity, for instance, and may be coupled to the same control terminal 206 to receive the same control signal. Some embodiments may include only a single transistor 202. Any number of transistors 202 may be connected in various series and/or parallel combinations to provide a suitable range of impedance values and/or current-carrying capability to accommodate varying applications and operational parameters.

The control signal 210 causes each of the transistors 202 to present a variable impedance and thereby causes the impedance circuit 200 to provide an overall impedance that depends upon the control signal 210. In various embodiments, the transistors 202 are controlled by the control signal 210 to operate in a triode region wherein the impedance provided by each of the transistors 202 is directly related (though not necessarily linearly) to the control signal 210. In certain embodiments, a control circuit determines and provides an appropriate control signal 210 to cause the impedance circuit 200 to provide a particular desired impedance value.

Figure 3:
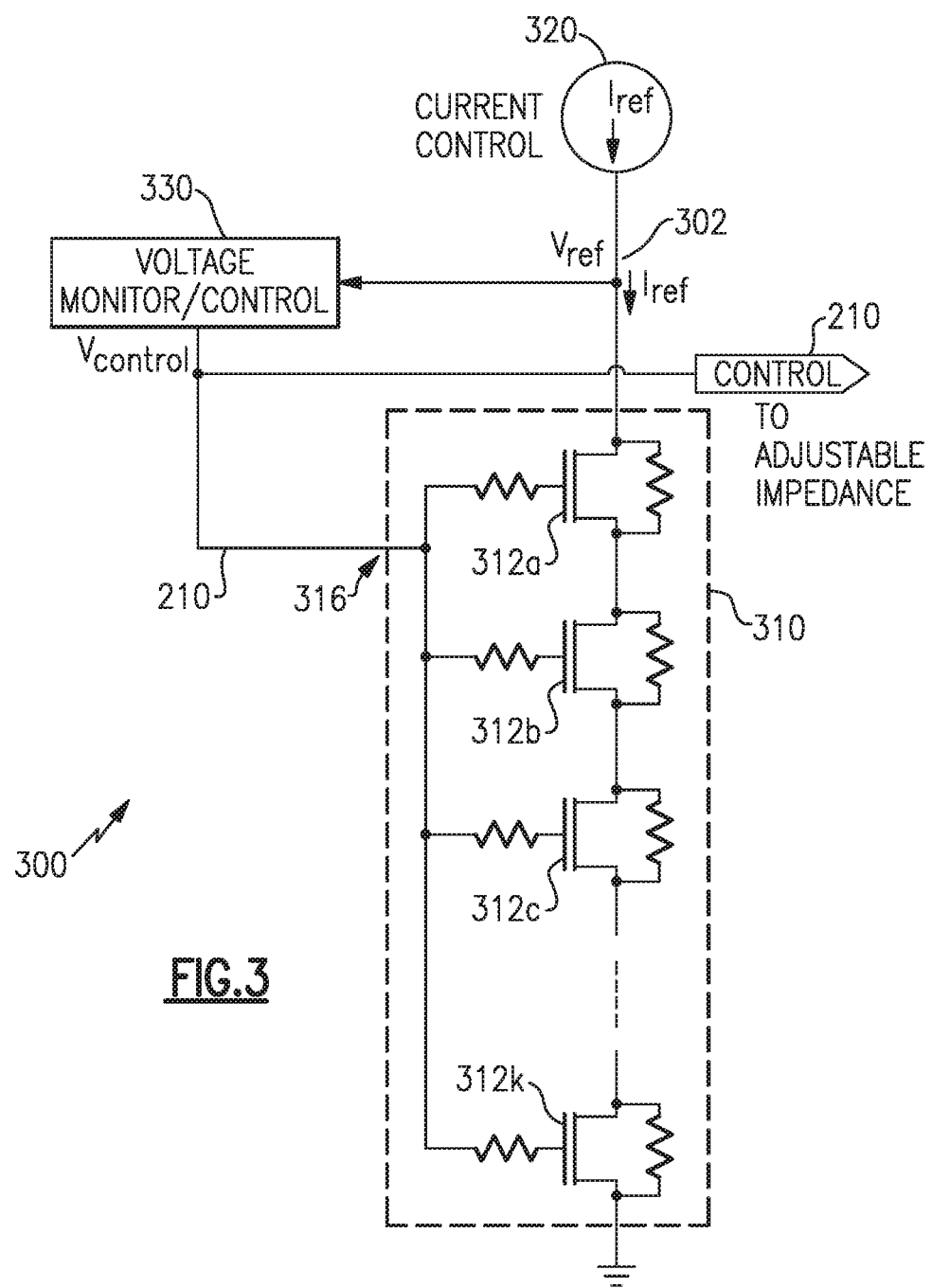
FIG. 3 is a schematic diagram of one example of a control circuit including a replica impedance.

FIG. 3 illustrates an example of a control circuit 300 that establishes and controls a current and a voltage at a control node 302. The control circuit 300 includes a replica circuit 310, a current source 320, and a voltage controller 330. The current and voltage at the control node 302 is representative of an impedance value provided by the replica circuit 310. The replica circuit 310 is similar to the impedance circuit 200 (as described in more detail below), though not necessarily identical, and includes one or more replica transistors 312. The replica circuit 310 is used to determine an appropriate control signal 210 to cause the impedance circuit 200 to provide the desired impedance value.

The current source 320 provides a known amount of current (a reference current, $I_{ref}$) through the control node 302 (and thereby the replica circuit 310). The voltage controller 330 maintains a known voltage (a reference voltage, $V_{ref}$) at the control node 302. The control node 302 is electrically connected to a terminal of the replica circuit 310 such that the reference voltage and the reference current at the control node 302 represent the voltage and current that the replica circuit 310 is exposed to. Accordingly, a ratio of the reference voltage to the reference current is representative of the impedance value provided by the replica circuit 310. The voltage controller 330 monitors the reference voltage at the control node 302 and adjusts an output control signal, e.g., the control signal 210, which adjusts the impedance value provided by the replica circuit 310, to maintain the reference voltage. In certain embodiments, the reference current and the reference voltage may be established to cause the replica circuit 310 to maintain a fixed impedance value. In other embodiments, an input may be provided, as described in more detail below, to allow the reference current and/or the reference voltage to be varied, to thereby allow tuning or adjustability of the impedance value provided by the replica circuit 310 (and thereby the impedance value of the impedance circuit 200, as describe further below).

Figure 4:
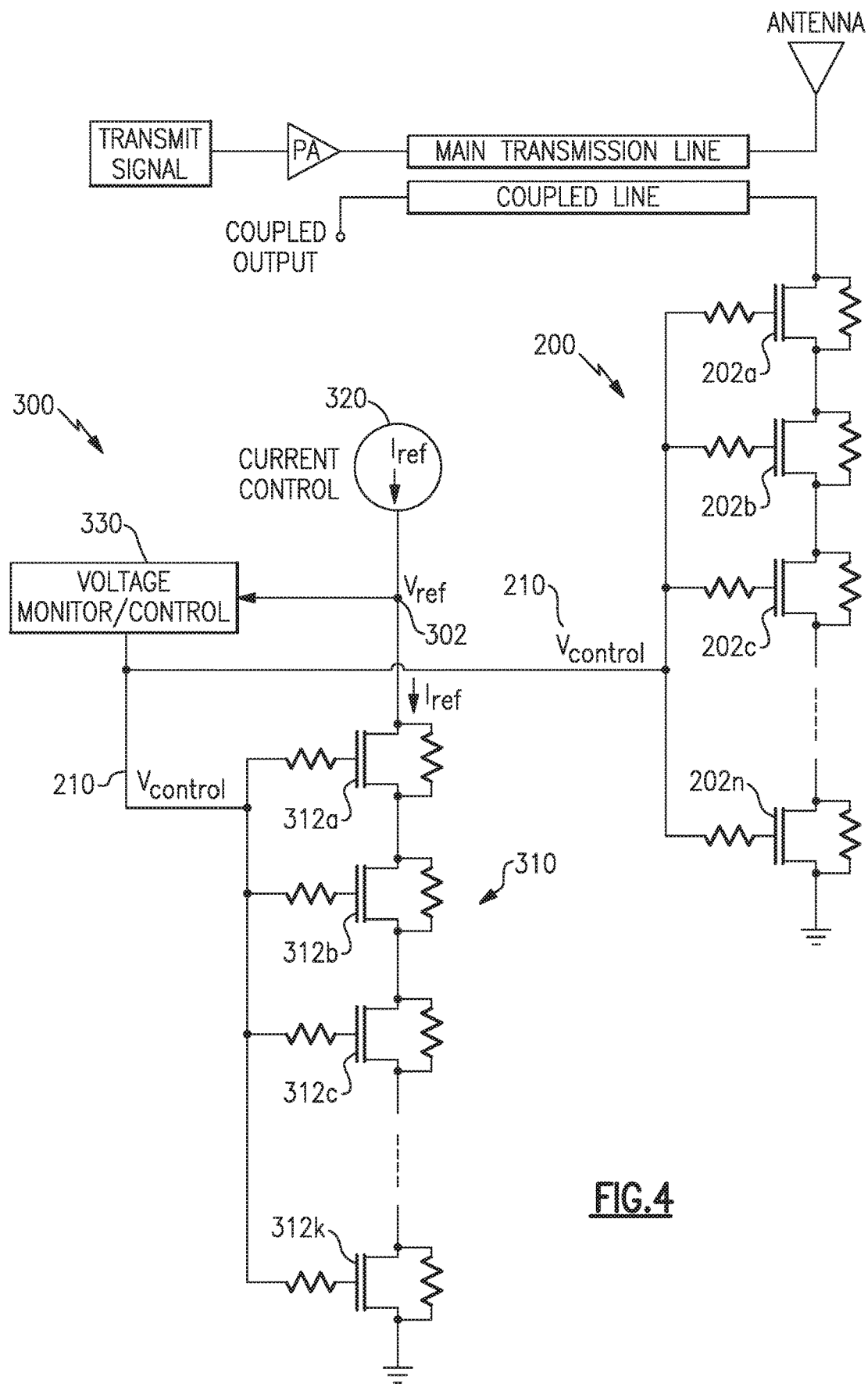
FIG. 4 is a schematic diagram of one example of coupling the control circuit of FIG. 3 to the tunable impedance of FIG. 2.

FIG. 4 illustrates the impedance circuit 200 as controlled by the control circuit 300. As the current source 320 and the voltage controller 330 operate to maintain an impedance value at the control node 302, the voltage controller 330 produces the control signal 210 that causes the replica circuit 310 to provide the impedance value at the control node 302. In certain embodiments, the impedance value provided by the impedance circuit 200 is directly related to the impedance value provided by the replica circuit 310 because the two circuits are similarly designed, and because the impedance circuit 200 receives the same control signal 210 as the replica circuit 310. To be similarly designed, in some embodiments, the replica circuit 310 may be formed of replica transistors 312 that are of the same design as the transistors 202 that form the impedance circuit 200, and the replica transistors 312 may be formed of the same materials, on the same die, and in the same physical orientation on the die, as the transistors 202, such that channel characteristics (e.g., in a FET) of the transistors 202 are similar to those of the replica transistors 312. It is not required that each of the replica transistors 312 be of an identical design to each of the transistors 202. Instead, it is sufficient for the transistors 202 to have a known or predictable operational characteristic (e.g., voltage and current relationship between two terminals) relative to a similar operational characteristic of the replica transistors 312. In certain embodiments, each of the transistors 202 and the replica transistors 312 may be formed of, e.g., 120 nm Silicon on insulator (SOI) technology, or 180 nm SOI technology, and may have a channel width of, e.g., 0.2 microns, and a channel length of, e.g., 20 microns, such that each of the transistors 202 and the replica transistors 312 may exhibit similar channel characteristics when exposed to the same control signal (e.g., at their respective gates).

Additionally, an arrangement of the replica transistors 312 need not be the same as the arrangement of the transistors 202. For example, a certain embodiment of the impedance circuit 200 may include seventy-five (75) sets, connected in parallel, of eight (8) series-connected transistors 202 each, and a replica circuit 310 for this certain embodiment may have fifteen (15) sets, connected in parallel, of four (4) series-connected transistors 312 each, with similar channel widths and lengths. The impedance circuit 200 receives the same control signal 210 as the replica circuit 310, and thus each of the individual transistors 202 may provide the same impedance as each of the individual replica transistors 312. However, the differing arrangement of the respective transistors in the circuits may cause the impedance circuit 200 to provide a different, but related, impedance value than the replica circuit 310. For instance, the impedance provided by an arrangement of components (e.g., transistors), relative to the impedance of each of the components, is well known, and determinable by traditional circuit analysis of series and parallel connected components.

Figure 5:
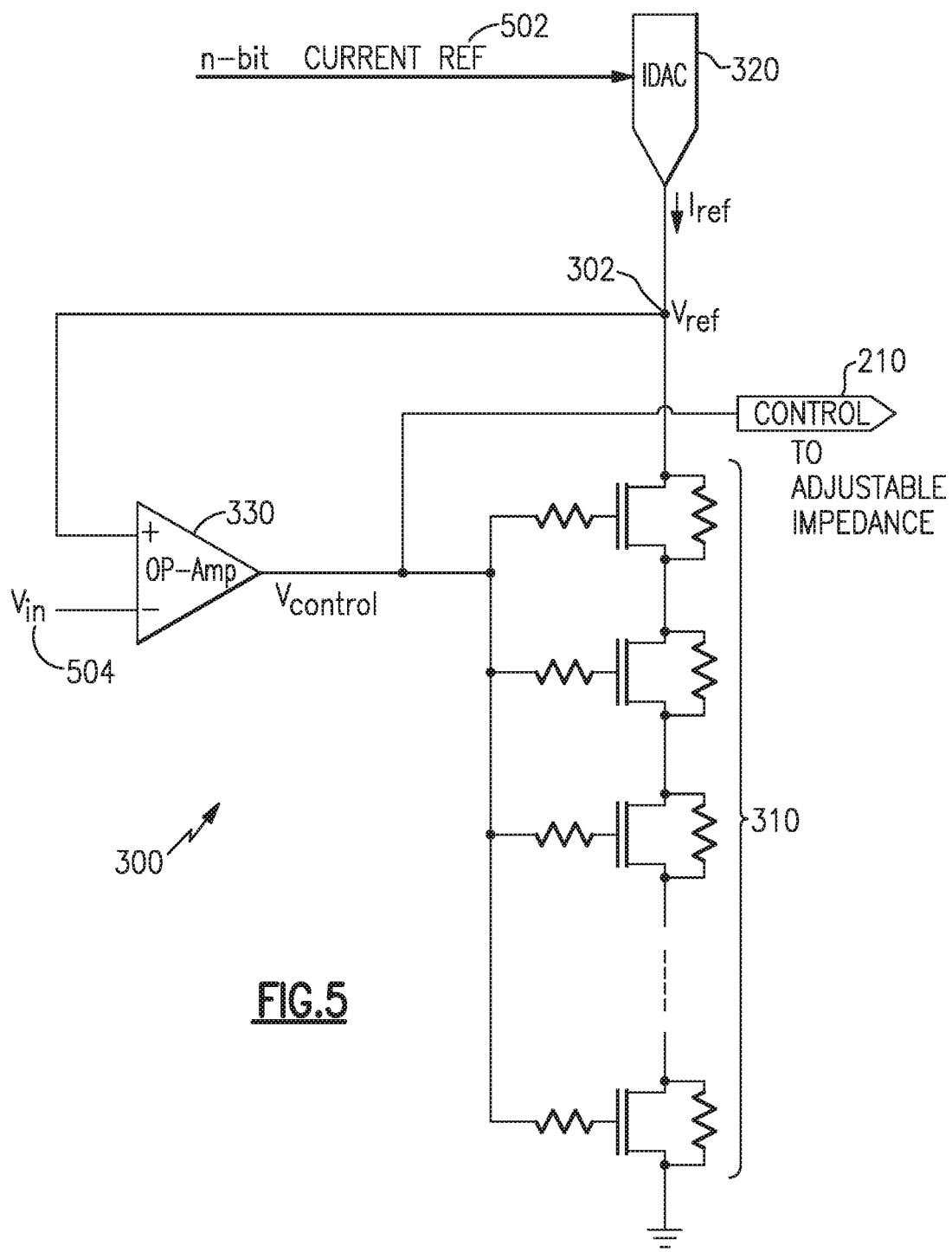
FIG. 5 is a schematic diagram of another example of a control circuit including a replica impedance.

FIG. 5 shows more specific details of the example of a control circuit 300. In some embodiments, the current source 320 may be a current digital to analog converter (IDAC) that produces and provides a specific (analog) current in response to receiving a digital input value 502. The IDAC may accept a digital input value 502 of varying bit-depth. In various embodiments, the current source 320 may be an IDAC with a 4-bit input, an 8-bit input, a 16-bit input, or more, for example. The digital input value 502 represents an amount of current the current source 320 is to provide as the reference current, $I_{ref}$, for example. Also shown in FIG. 5, and in some embodiments, is the voltage controller 330 implemented as an operational amplifier. The operational amplifier may be connected to the control node 302 at one input, and may receive an input voltage 504 at another input. A difference between the two inputs causes the operational amplifier to produce a control voltage, which is the control signal 210, that causes the replica circuit 310 to maintain the voltage at the control node 302. Accordingly, the voltage controller 330 provides a control signal 210 that causes the replica circuit 310 to provide an impedance determined by the digital input value 502 (indicative of the reference current) and the input voltage 504 (indicative of the reference voltage). Either of the digital input value 502 or the input voltage 504 may be varied to adjust the impedance produced by the replica circuit 310 and, accordingly, the impedance circuit 200.

In some embodiments, the impedance provided by the impedance circuit 200 is tunable by varying the digital input value 502 so that the current source 320 provides a different current through the replica circuit 310, and thereby causes the voltage controller 330 to adjust the control signal 210 so that the replica circuit 310 alters its impedance to maintain a fixed voltage at the control node 302. Accordingly, the control signal 210 changes to cause the impedance circuit 200 to provide a desired impedance indicated by the digital input value 502. In other words, the impedance provided by the impedance circuit 200 may be adjusted or tuned by changing the digital input value 502, in some embodiments.

Figure 6:
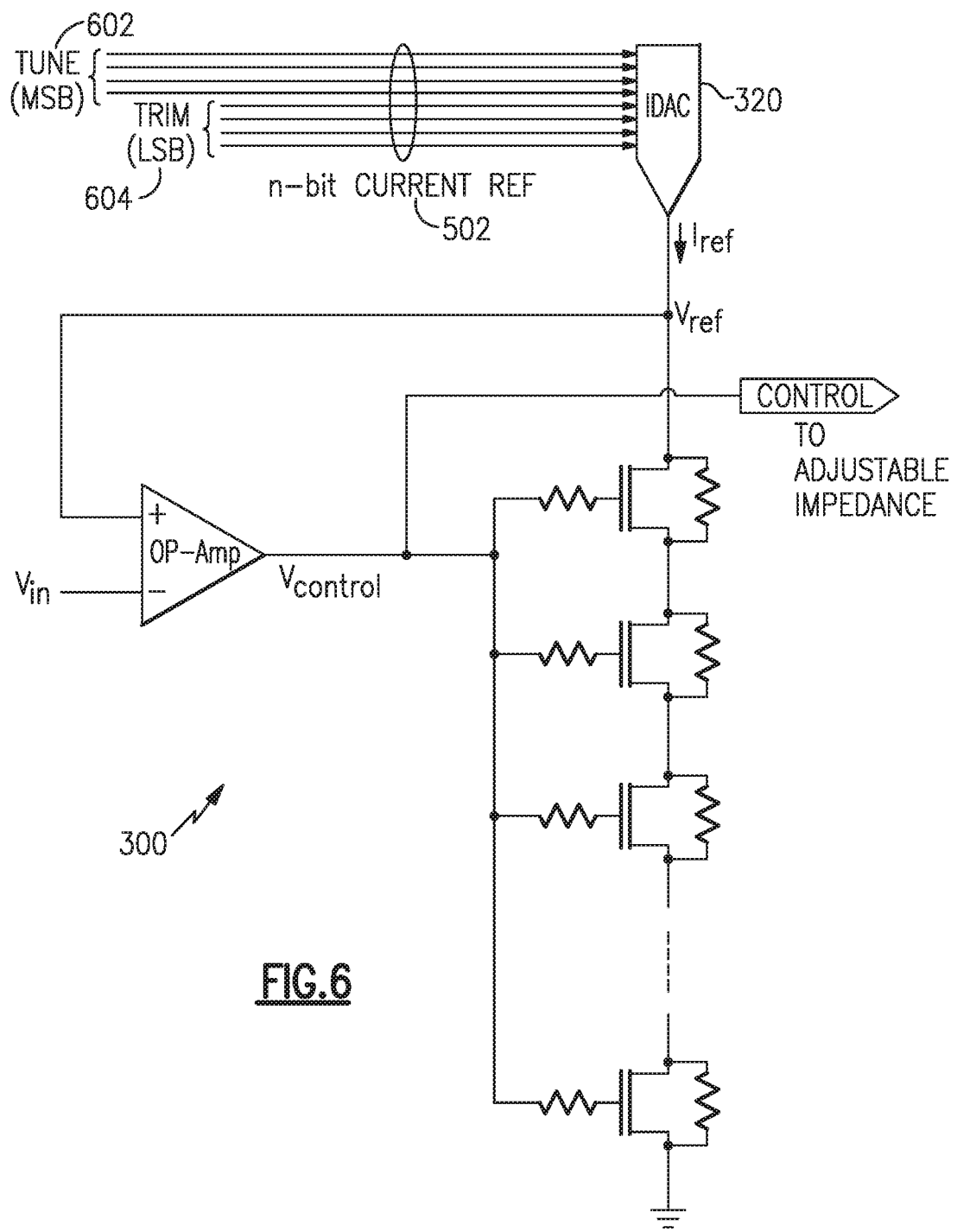
FIG. 6 is a schematic diagram of another example of a control circuit including a replica impedance.

For example, and with reference to FIG. 6, further detail of an example embodiment of the current source 320 of the control circuit 300 is shown. As shown, the current source 320 may be an IDAC with an 8-bit input in some embodiments. The 8-bit input may be defined to include a tune input 602 and a trim input 604. In the example of FIG. 6, the tune input 602 and the trim input 604 are defined as 4-bits each of the 8-bit input. Further to this example, the tune input 602 includes the most significant bit (MSB) portion of the 8-bit input, and the trim input 604 includes the least significant bit (LSB) portion of the 8-bit input. Accordingly, a tune value provided at the tune input 602 provides a large scale adjustment to the current source 320 and, therefore, a large scale adjustment to the impedance provided by the impedance circuit 200. A trim value provided at the trim input 604 provides a minor scale adjustment to the current source 320, and thus a minor scale adjustment to the impedance provided by the impedance circuit 200.

In some embodiments, the trim input 604 may be used to account for manufacturing variations. For example, the trim input 604 may be set at the time of manufacture to a fixed binary input, as a result of testing, to establish the proper range of adjustments to be allowed by the tune input 602. For instance, in some embodiments, the impedance circuit 200 may be desired to provide a particular impedance, e.g., 50 Ohms, which may be at a particular frequency, when a median value is provided at the tune input 602. Upon testing a particular manufactured unit, a value to be provided at the trim input 604 may be selected that causes the impedance circuit 200 to provide the closest possible impedance to 50 Ohms when the given median value is provided at the tune input 602. In some embodiments, the selected value to be provided at the trim input 604 may be hardwired or otherwise permanently electrically connected to the trim input 604.

Figure 7:
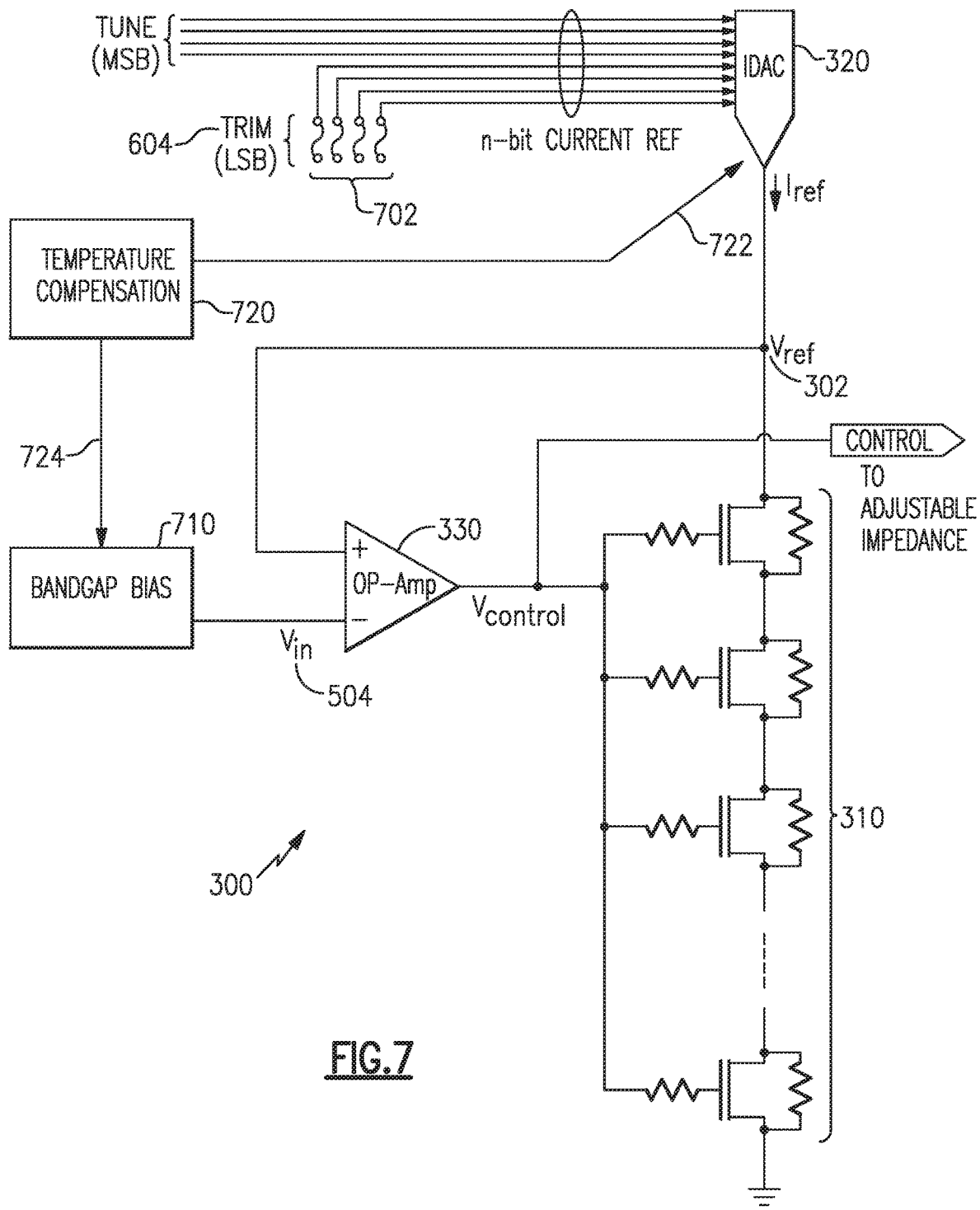
FIG. 7 is a schematic diagram of another example of a control circuit including a replica impedance.

FIG. 7 illustrates the above described trim adjustment, as well as additional details of further adjusting and/or compensating components that may be provided in some embodiments. In FIG. 7, the trim input 604 is shown including breakers 702 that may be electrically connected to an input value at the time of original manufacture, but that may be etched or removed to establish a permanently selected value provided at the trim input 604. The permanently selected value may be determined based on testing and/or characterization of the specifically resulting manufactured unit, such that, e.g., a median value provided at the tune input 602 produces an impedance by the impedance circuit 200 as close to a particular impedance, e.g., 50 Ohms, as possible.

Further adjusting components may include a bandgap bias circuit 710 that provides an adjusted input voltage 504 to the voltage controller 330 to account for variations in bandgap bias. A bandgap reference may demonstrate process variation due to various mismatches between devices during fabrication, and may cause a shift in reference voltage (to be maintained at the control node 302), which in turn may cause impedance variation. Accordingly, the bandgap bias circuit 710 may provide an adjusted voltage to compensate for such effect and stabilize the reference voltage at the control node 302. In some embodiments, the trimming process discussed above may additionally or alternately compensate for some of this variation.

Additionally, a temperature compensating circuit 720 may be included in some embodiments that provides an input signal 722 to the current source 320 and/or an input signal 724 to the bandgap bias circuit 710 to cause various adjustments, e.g., as to what values of reference current and reference voltage are to be maintained at the control node 302, as compensation for temperature variations. In some embodiments, the temperature compensating circuit 720 may be a proportional to absolute temperature (PTAT) circuit. Ultimately, the reference current provided in FIG. 7 is based (at least in part) upon a bandgap voltage sourced across an on-die resistance. A scaled version of the on-die resistance is effectively mapped to the replica circuit 310 via the voltage controller 330 (which acts as a feedback circuit). The on-die resistance may have a given temperature coefficient due to material properties, and any temperature drift of the on-die (reference) resistance will be mapped to the replica circuit 310 and affect the termination impedance at node 204. Accordingly, the temperature compensating circuit 720 compensates for any such temperature drift such that the replica circuit 310 (and the impedance circuit 200) provides a constant impedance over temperature.

Figure 8A:
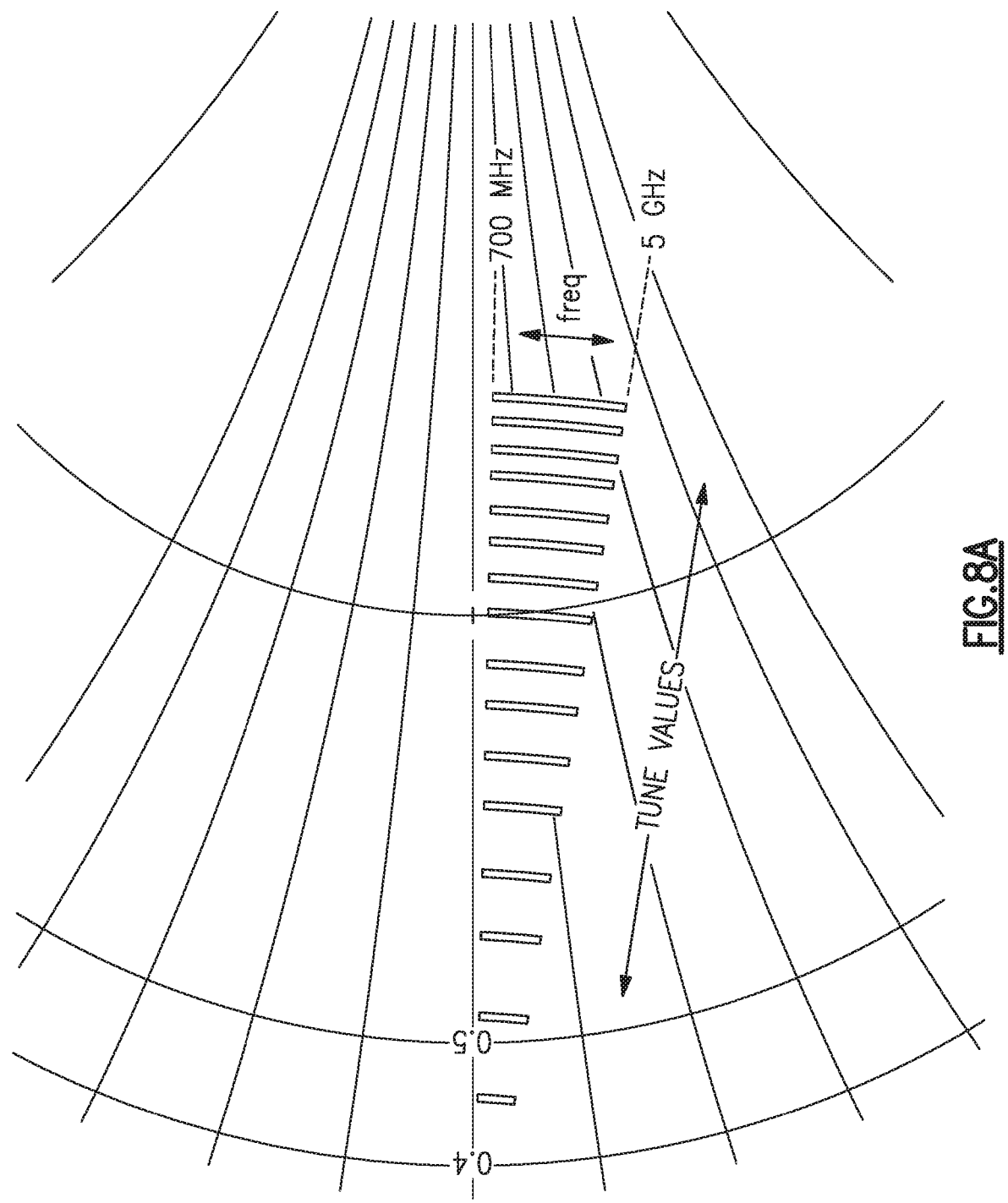
FIGS. 8A-8C are Smith chart diagrams of various performance results of prototype examples of a tunable impedance controlled by the control circuits of FIGS. 5-7.

FIG. 8A is a Smith chart illustrating a graph of simulated results of impedance values provided by an impedance circuit 200 for sixteen different tune values, and across a range of frequencies from 700 MHz to 5 GHz.

Figure 8B:
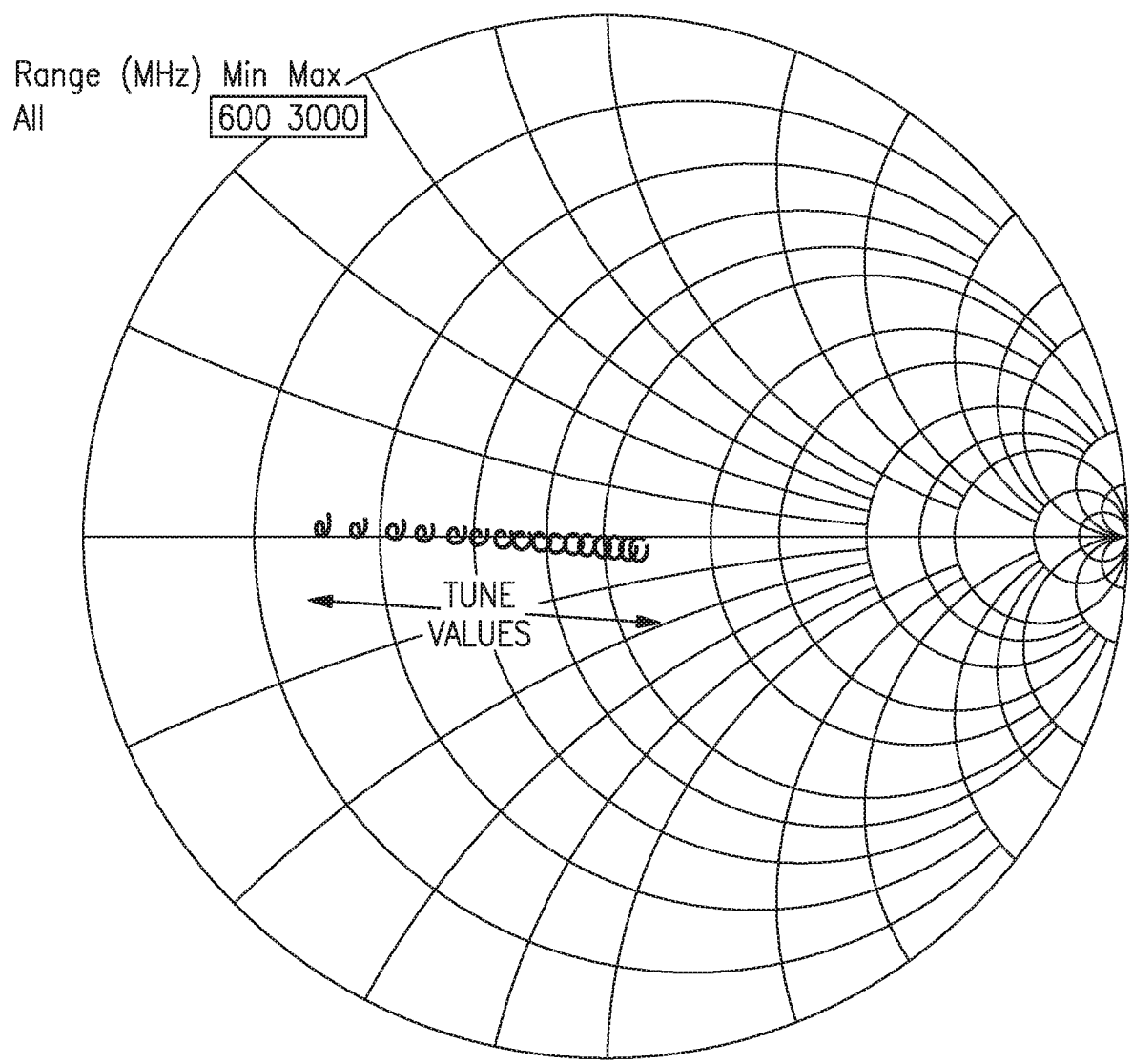

FIG. 8B is a Smith chart illustrating a graph of experimental results of impedance values provided by an impedance circuit 200 for sixteen different tune values, and across a range of frequencies from 600 MHz to 3 GHz.

Figure 8C:
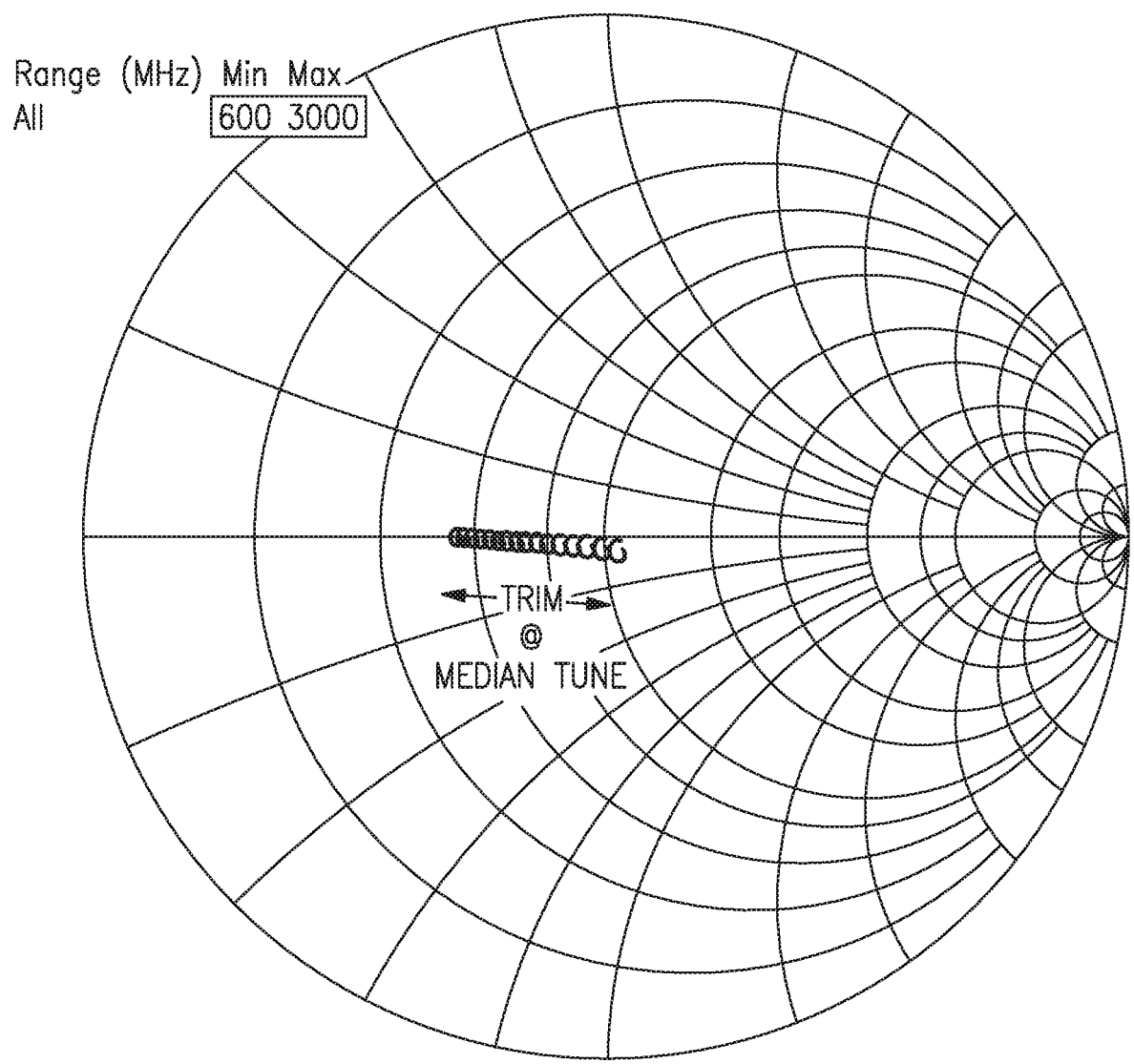

FIG. 8C is a Smith chart illustrating a graph of experimental results of impedance values provided by an impedance circuit 200 at a median tune value for sixteen different trim values, and across a range of frequencies from 600 MHz to 3 GHz.

Embodiments of tunable impedances as described herein can be implemented in a variety of different modules including, for example, a stand-alone impedance module, a coupler module, a front-end module, a module combining the tunable impedance with an antenna switching network, an impedance matching module, an antenna tuning module, or the like.

Modules may include a substrate and may include various dies and may include packaging, such as, for example, an overmold to provide protection and facilitate easier handling. An overmold may be formed over substrate and dimensioned to substantially encapsulate the various dies and components thereon. The module may further include connectivity from the tunable impedance or other components to the exterior of the packaging to provide signal interconnections, such as an input port connection, output port connection, coupled port connection, control input connection, etc. Certain examples may have multiple connections to accommodate access to various individual components in the module. The various connections may be provided in part by wirebonds or solder bumps, for example, and may include multiple electrical connections where appropriate.

Embodiments of the tunable impedances disclosed herein, optionally packaged into a module, may be advantageously used in a variety of electronic devices. Examples of the electronic devices can include, but are not limited to, consumer electronic products or components thereof, electronic test equipment, communications infrastructure (such as a base station, router, transmitter, etc.) and more. Specific examples of such electronic devices can include, but are not limited to, a mobile phone such as a smart phone, a tablet, a telephone, a television, a computer or computer peripheral, a modem, such as a cable modem or otherwise, a wireless router or access point, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

General examples of an electronic device may include a circuit board having numerous modules mounted thereon. The circuit board may have multiple layers and may include circuit elements and interconnections in the layers and/or mounted on the surface of the circuit board. Each of the modules may have a multi-layer substrate within and upon which there may also be various circuit elements and interconnections. Additionally, the modules may further include dies, each of which may have multiple layers and include various circuit elements and interconnections. A tunable impedance in accord with aspects and embodiments disclosed herein may be implemented within, among, or across any of the layers of the various structures, e.g., circuit board, substrates, and dies, as part of an electronic device, such as a cell phone, tablet, smart device, router, cable modem, wireless access point, etc.

Figure 9:
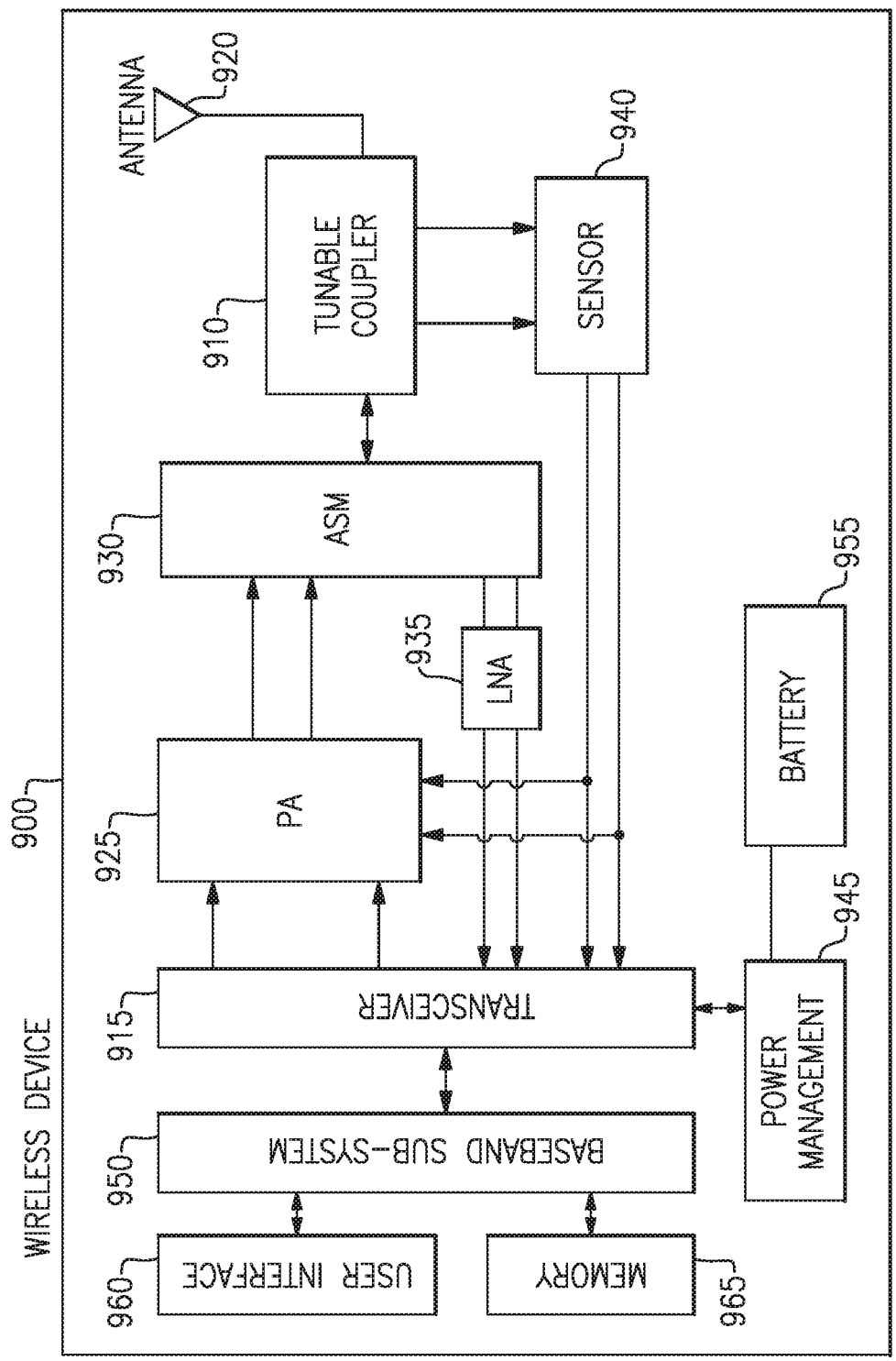
FIG. 9 is a block diagram of one example of wireless device in which an electromagnetic coupler with a tunable impedance can be used.

FIG. 9 is a block diagram of one example of a wireless device 900 in which an electromagnetic coupler with an adjustable impedance circuit 200 may be used. In one example, the electromagnetic coupler 910 is configured to extract a portion of power of an RF signal traveling between a transceiver 915 and an antenna 920. In general, the electromagnetic coupler 910 is a bi-directional coupler. As illustrated, in the forward or transmit direction, a power amplifier 925 receives a transmit signal, such as an RF signal, from the transceiver 915 and provides an amplified signal to the antenna 920 via an antenna switch module 930 and the electromagnetic coupler 910. Similarly, in the receive direction, a received signal is provided from the antenna 920 to the transceiver 915 via the electromagnetic coupler 910, the antenna switch module 930, and a low noise amplifier 935.

The power amplifier 925 amplifies the transmit signal. The power amplifier 925 can be any suitable power amplifier. For example, the power amplifier 925 can include one or more of a single stage power amplifier, a multi-stage power amplifier, a power amplifier implemented by one or more bipolar transistors, or a power amplifier implemented by one or more field effect transistors. The power amplifier 925 can be implemented on a GaAs die, CMOS die, or a SiGe die, for example. The power amplifier 925 can be used to amplify a wide variety of RF or other frequency-band transmission signals. For example, the power amplifier 925 can receive an enable signal that can be used to pulse the output of the power amplifier to aid in transmitting a wireless local area network (WLAN) signal or any other suitable pulsed signal. The power amplifier 925 can be configured to amplify any of a variety of types of signal, including, for example, a Global System for Mobile (GSM) signal, a code division multiple access (CDMA) signal, a W-CDMA signal, a Long Term Evolution (LTE) signal, an EDGE signal, and the like.

The antenna 920 can transmit the amplified transmit signal and receive signals. For example, in a cellular phone, wireless base station, or the like, the antenna 920 can transmit and receive RF signals to and from other devices. In alternate embodiments multiple antennas may be used.

Operating in the forward mode, the electromagnetic coupler 910 can extract a portion of the power of the amplified signal traveling between the power amplifier 925 and the antenna 920. The electromagnetic coupler 910 can provide a coupled signal representative of forward power traveling from the power amplifier 925 to the antenna 920, for example. Operating in the reverse mode, the coupled signal may represent reflected power traveling from the antenna 920 toward the power amplifier 925, for example. In either mode, the electromagnetic coupler 910 may provide the signal portion to a sensor 940 that provides power feedback by measuring the power of the signal portion. The sensor 940 can in turn send information to the transceiver 915 and/or directly to the power amplifier 925 as feedback for making adjustments to regulate the power level of the power amplifier 925. In this way the electromagnetic coupler 910 can be used to boost/decrease the power of a transmission signal having a relatively low/high power.

The example of the wireless device 900 may further include a power management system 945 that is connected to the transceiver 915 that manages the power for the operation of the wireless device. The power management system 945 can also control the operation of a baseband sub-system 950 and other components of the wireless device 900. The power management system 945 may manage power within the wireless device 900 by, for example, providing power to the wireless device 900 from a battery 955 or providing power to the wireless device 900 from a power connector, and controlling a charge level of the battery 955 by controlling charge and discharge cycles and/or status of the battery 955.

In one embodiment, the baseband sub-system 950 is connected to a user interface 960 to facilitate various input and output of voice and/or data provided to and received from the user. The baseband sub-system 950 can also be connected to memory 965 that is configured to store data and/or instructions to facilitate operation of the wireless device 900, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A tunable impedance circuit comprising:
   a transistor assembly having two terminals and a first control input, the transistor assembly having a plurality of transistors electrically connected in series between the two terminals, the plurality of transistors arranged to provide a first impedance between the two terminals based upon a control signal received at the first control input, each transistor of the plurality of transistors including a gate coupled to the first control input;
   a plurality of replica transistors electrically connected together in series and having a second control input, the plurality of replica transistors arranged to provide a replica impedance based upon the control signal received at the second control input and a reference current provided through the plurality of replica transistors, each replica transistor of the plurality of replica transistors including a gate coupled to the second control input; and
   a control circuit configured to generate the control signal based upon at least one of a reference voltage across the plurality of replica transistors and the reference current provided to the plurality of replica transistors, the control circuit being further configured to maintain the replica impedance by adjusting the control signal.

2. The tunable impedance circuit of claim 1 wherein the plurality of transistors are arranged to provide the first impedance as a multiple of the replica impedance.

3. The tunable impedance circuit of claim 1 wherein the control circuit is configured to provide the reference current through the plurality of replica transistors, to sense a voltage across the plurality of replica transistors to generate the control signal, and to maintain a fixed voltage across the plurality of replica transistors by adjusting the control signal.

4. The tunable impedance circuit of claim 3 wherein the control circuit is configured to provide the reference current based upon a digital input value, the digital input value having a tune value and a trim value.

5. The tunable impedance circuit of claim 1 wherein the control circuit is configured to maintain a fixed voltage across the plurality of replica transistors by adjusting the control signal, and to maintain the replica impedance by adjusting the reference current provided to the plurality of replica transistors.

6. The tunable impedance circuit of claim 5 wherein the control circuit is configured to adjust the reference current based upon temperature.

7. The tunable impedance circuit of claim 5 wherein the control circuit includes an operational amplifier configured to maintain the fixed voltage.

8. The tunable impedance circuit of claim 1 wherein each of the plurality of replica transistors is of the same type as each of the plurality of transistors.

9. The tunable impedance circuit of claim 1 wherein each of the plurality of transistors is configured to operate in a triode region in response to the control signal received at the first control input.

10. A tunable impedance circuit comprising:
    a plurality of transistors electrically connected together in series to provide two terminals and a first control input, each transistor of the plurality of transistors including a gate coupled to the first control input;
    a current source to provide a reference current into one of the two terminals and through the plurality of transistors, the plurality of transistors arranged to provide an impedance between the two terminals based upon a control signal received at the first control input and the reference current;
    a sensing circuit configured to sense a reference voltage between the two terminals and to generate the control signal based upon at least one of the reference voltage and the reference current, the sensing circuit being further configured to maintain the impedance by adjusting the control signal; and
    a plurality of termination transistors connected together in series and arranged to receive the control signal at a second control input to provide a termination impedance based upon the control signal, each transistor of the plurality of termination transistors including a gate coupled to the second control input.

11. The tunable impedance circuit of claim 10 wherein the current source is configured to provide the reference current through the plurality of transistors.

12. The tunable impedance circuit of claim 10 wherein the current source is configured to provide the reference current based upon a digital input value having a tune value and a trim value.

13. The tunable impedance circuit of claim 10 wherein each of the plurality of transistors is configured to operate in a triode region in response to the control signal received at the control input.

14. The tunable impedance circuit of claim 10 wherein the sensing circuit includes an operational amplifier configured to receive the voltage at an input of the operational amplifier.

15. A method of controlling impedance of a plurality of transistors operating in a triode region of operation, the method comprising:
providing a control signal to a first control input of a plurality of replica transistors electrically connected in series causing the plurality of replica transistors to operate in a triode region, each replica transistor of the plurality of replica transistors including a gate coupled to the first control input;
providing a reference current through the plurality of replica transistors, the reference current entering the plurality of replica transistors at a first terminal and exiting the plurality of replica transistors at a second terminal, the plurality of replica transistors arranged to provide a replica impedance based upon the control signal received at the first control input and the reference current;
sensing a reference voltage between the first terminal and the second terminal, the reference voltage being across the plurality of replica transistors;
adjusting the control signal to maintain a desired ratio of the reference voltage to the reference current; and
providing the control signal to a second control input of the plurality of transistors to provide a second impedance based upon the control signal, the plurality of transistors being electrically connected in series and each transistor of the plurality of transistors including a gate coupled to the second control input.

16. The method of claim 15 wherein adjusting the control signal to maintain a desired ratio of the reference voltage to the reference current includes adjusting the control signal to maintain a constant reference voltage.

17. The method of claim 16 wherein the constant reference voltage is based upon a reference voltage that is compensated for at least one of temperature and bandgap bias.

18. The method of claim 15 wherein adjusting the control signal to maintain a desired ratio of the reference voltage to the reference current includes adjusting the control signal to maintain the reference voltage at a fixed value, the desired ratio of the reference voltage to the reference current being determined by an amount of the provided reference current.

19. The method of claim 15 further comprising adjusting the desired ratio of the reference voltage to the reference current by changing the reference current provided through the plurality of replica transistors.

20. The method of claim 15 further comprising receiving a digital input value and providing the reference current based upon the digital input value, the digital input value including receiving a tune value and a trim value.

* * * * *